United States Patent [19]

May et al.

[11] Patent Number: 5,727,038
[45] Date of Patent: Mar. 10, 1998

[54] PHASE LOCKED LOOP USING DIGITAL LOOP FILTER AND DIGITALLY CONTROLLED OSCILLATOR

[75] Inventors: Michael R. May, Austin; Michael D. Cave, Pflugerville, both of Tex.

[73] Assignee: Motorola, Inc., Schaumburg, Ill.

[21] Appl. No.: 707,828

[22] Filed: Sep. 6, 1996

[51] Int. Cl.[6] ................................................ H03D 3/24
[52] U.S. Cl. ................................ 375/376; 331/25
[58] Field of Search ................................ 375/376, 327; 331/18, 1 A, 25; 327/147, 150, 156, 159

[56] References Cited

U.S. PATENT DOCUMENTS

| 4,019,153 | 4/1977 | Cox, Jr. et al. | 331/1 A |
|---|---|---|---|
| 4,577,163 | 3/1986 | Culp | 331/1 A |
| 5,173,617 | 12/1992 | Alsup et al. | 327/159 |
| 5,337,335 | 8/1994 | Cloetens et al. | 375/376 |
| 5,347,234 | 9/1994 | Gersbach et al. | 331/1 A |
| 5,517,155 | 5/1996 | Yamauchi et al. | 331/1 A |
| 5,552,785 | 9/1996 | Wilson et al. | 341/143 |
| 5,574,454 | 11/1996 | Wilson et al. | 341/143 |
| 5,598,448 | 1/1997 | Girardeau, Jr. | 375/376 |

OTHER PUBLICATIONS

Riley, et al.; "Delta-Sigma Modulation in Fractional-N Frequency Synthisis"; IEEE Journal of Solid State Circuits; vol. 28, No. 5; pp. 553-559 (1993).

*Primary Examiner*—Stephen Chin
*Assistant Examiner*—Betsy L. Deppe

[57] ABSTRACT

A phase locked loop (10) with a phase detector (11), a digital loop filter (12), a digital controlled oscillator (13) and a divide-by-N circuit (14) generates a periodic signal which has a predetermined phase and voltage related to a reference clock signal. A phase and frequency detector (21) outputs an average of error between a feedback delay clock and a reference clock to the digital loop filter (12). The digital loop filter (12) processes the phase detector (11) output and the inband quantization noise utilizing a sigma delta converter. The digital loop filter (12) utilizes a non binary weight scheme to minimize the number of bits changing states. The digital controlled oscillator (13) generates a loop clock signal utilizing a plurality of digital programmable delay elements. A divide-by-N circuit (14) performs a divide by 2560.

6 Claims, 8 Drawing Sheets

| (Q-4) BITS PREDECODE SIGNAL | (M-4) BITS SELECT SIGNAL |
|---|---|
| INPUT | OUTPUT |
| DIGIT WEIGHT   8 4 2 1 | 4 2 1 1 1 1 1 1 1 1 |
| 0 0 0 0 | 0 0 0 0 0 0 0 0 0 0 |
| 0 0 0 1 | 0 0 0 0 0 0 0 0 0 1 |
| 0 0 1 0 | 0 0 0 0 0 0 0 0 1 1 |
| 0 0 1 1 | 0 0 0 0 0 0 0 1 1 1 |
| 0 1 0 0 | 0 0 0 0 0 0 1 1 1 1 |
| ⋮ | ⋮ |
| 1 0 0 1 | 0 0 1 1 1 1 1 1 1 1 |
| 1 0 1 0 | 0 1 0 1 1 1 1 1 1 1 |
| 1 0 1 1 | 0 1 1 1 1 1 1 1 1 1 |
| 1 1 0 0 | 1 0 0 1 1 1 1 1 1 1 |
| ⋮ | ⋮ |
| 1 1 1 1 | 1 1 1 1 1 1 1 1 1 1 |

FIG.6

```
    CSERIAL = 0;
IF (((PFC & 0x100) == 0x100) && ((RANDOM & 0x1) == 0x1))
    CSERIAL = 1;
IF (((PFC & 0x80) == 0x80) && ((RANDOM & 0x3) == 0x2))
    CSERIAL = 1;
IF (((PFC & 0x40) == 0x40) && ((RANDOM & 0x7) == 0x4))
    CSERIAL = 1;
IF (((PFC & 0x20) == 0x20) && ((RANDOM & 0xF) == 0x8))
    CSERIAL = 1;
IF (((PFC & 0x10) == 0x10) && ((RANDOM & 0x1F) == 0x10))
    CSERIAL = 1;
IF (((PFC & 0x8) == 0x8) && ((RANDOM & 0x3F) == 0x20))
    CSERIAL = 1;
IF (((PFC & 0x4) == 0x4) && ((RANDOM & 0x7F) == 0x40))
    CSERIAL = 1;
IF (((PFC & 0x2) == 0x2) && ((RANDOM & 0xFF) == 0x80))
    CSERIAL = 1;
IF (((PFC & 0x1) == 0x1) && ((RANDOM & 0x1FF) == 0x100))
    CSERIAL = 1;
```

PHASE LOCKED LOOP USING DIGITAL LOOP FILTER AND DIGITALLY CONTROLLED OSCILLATOR

FIELD OF THE INVENTION

The present invention generally relates to digital electronic devices and more specifically to phase-locked loop oscillators.

BACKGROUND OF THE INVENTION

Oscillators are used to generate clocks in a variety of devices. Phase-Locked Loops (PLL) are one type of oscillator used in microprocessors, digital signal processors and memory devices. PLL's synchronize output clock signals with a master reference signal insuring that each system element requiring an output clock signal receives a consistent clock signal.

PLLs consist of a phase detector, charge pump, voltage controlled oscillator (VCO) synchronizing clock signals with a master reference signal. In one example, multiple clock signals for multiple processors are synchronized with each other. One master reference signal coordinates all the functions of the processors. However, due to different configurations and process variations, each circuit element within a single processor receives a skewed version of the master reference signal. Phase-Locked Loops eliminate this problem by synchronizing the clock for each processor with the master reference signal. This insures stable, synchronized timing within each microprocessor.

Phase locked loops generate a periodic signal with a predetermined phase and voltage relationship to a reference clock signal, REFCLK. Typically, an analog phase locked loop contains analog components including capacitors and resistors. Analog components are susceptible to process and temperature variation. Simple analog phase locked loop revisions result in longer simulation and design cycle times. For example, changing the gain of an analog oscillator requires simulation insuring all the transistors in the analog oscillator are in saturation. A need exists for a simple process tolerant phase locked loop methodology.

BRIEF DESCRIPTION OF THE DRAWINGS

The features and advantages of the present invention will be more clearly understood from the following detailed description taken in conjunction with the accompanying figures where like numerals refer to like and corresponding parts and in which.

DESCRIPTION OF A PREFERRED EMBODIMENT

The phase locked loop of the present invention does not require capacitors and resistors associated with a charge pump or an analog oscillator. Instead, the phase locked loop contains digital components. With a digital design, design revisions have shorter design cycle times due to decreased design complexity. Digital phase locked loops limit the amount of process variation, resulting in an improvement in performance and yield. In a digital design, a design change only affects digital components that are directly coupled. Digital design changes can be simple, for example, changing the number of bits in a state machine. The changes are synthesized and simulated with commercially available software within minutes. Testability coverage increases with the use of a full test scan. The phase locked loop of the present invention is compatible with a full scan approach. Full scan checks for structure and connectivity and detects opens and shorts. Full scan improves quality and decreases production test times.

Figure 1:
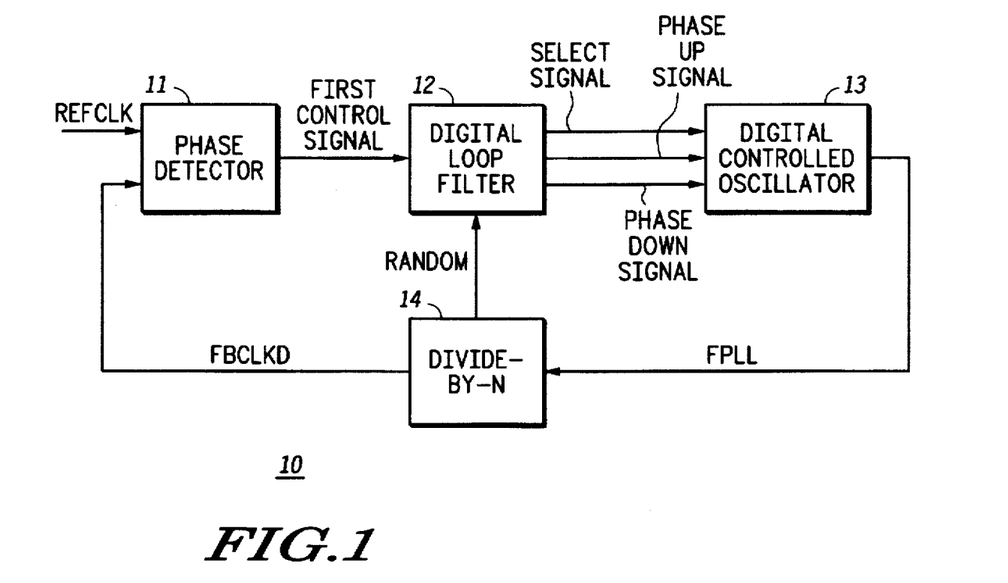
FIG. 1 depicts a block diagram of a phase locked loop constructed in accordance with the present invention.

FIG. 1 depicts a block diagram of a phase locked loop 10 constructed in accordance with the present invention. FIG. 1 depicts a phase detector 11, a digital loop filter 12, a digital controlled oscillator 13, and a divide-by-N circuit 14. The phase locked loop 10 of the present invention generates a periodic signal, FPLL, with a predetermined phase and voltage relation to a reference clock signal, REFCLK. Phase detector 11 receives the reference clock signal, REFCLK, and a feedback delay clock signal, FBCLKD. Phase detector 11 outputs a FIRST CONTROL SIGNAL, provided as input to the digital loop filter 12. The digital loop filter 12 outputs a SELECT SIGNAL, a PHASE UP SIGNAL and a PHASE DOWN SIGNAL. All three signals are provided as inputs to the digital controlled oscillator 13. The digital controlled oscillator 13 outputs a loop clock signal, FPLL, to the divide-by-N circuit 14. The divide-by-N circuit 14 outputs the feedback delay clock signal, FBCLKD, to the phase detector 11 and outputs a RANDOM signal to the digital loop filter 12.

Phase detector 11 receives the reference clock signal, REFCLK, and the feedback delay clock signal, FBCLKD. The reference clock signal originates from any of the following: a system clock, a telephony application, or an external crystal source. In the described embodiment, the reference clock signal, REFCLK, is an 8 kilohertz signal. The phase detector 11 generates the FIRST CONTROL SIGNAL ("FCS", hereafter) by comparing the phase of the feedback delay clock signal, FBCLKD, with the phase of the reference clock signal, REFCLK. Generation of the FCS and the phase detector 11 are discussed below in FIG. 2.

Digital loop filter 12 receives the FIRST CONTROL SIGNAL and generates the SELECT SIGNAL, the PHASE UP SIGNAL and the PHASE DOWN SIGNAL. The SELECT SIGNAL is an M (where M is an integer) bit output that has been decoded using a non-conventional scheme described below in FIG. 6. The SELECT SIGNAL, the PHASE UP SIGNAL and the PHASE DOWN SIGNAL are provided to the input of the digital controlled oscillator 13. The SELECT SIGNAL, the PHASE UP SIGNAL and the PHASE DOWN SIGNAL are described below in FIGS. 4 and 5. The PHASE UP SIGNAL and the PHASE DOWN SIGNAL control the phase of the loop clock signal FPLL with a series of delay elements, digital switches and D Flip Flops in the digital controlled oscillator 13.

The digital controlled oscillator 13 receives the SELECT SIGNAL, the PHASE UP SIGNAL and the PHASE DOWN SIGNAL. THE SELECT SIGNAL controls the frequency of the loop clock signal FPLL. The inputs to the digital controlled oscillator control the phase and frequency of the loop clock signal FPLL with a series of delay elements, digital switches and D Flip Flops. The loop clock signal, FPLL, is a clocking signal used in various applications including radios, personal computers, and televisions. The loop clock signal, FPLL, and the digital controlled oscillator 13 are discussed below in FIG. 9.

The divide-by-N circuit 14 receives the loop clock signal, FPLL, and performs a frequency division on the loop clock signal, FPLL. The divide-by-N circuit 14 generates the feedback delay clock signal, FBCLKD, which is provided as input to the phase detector 11. The divide-by-N circuit 14 generates the RANDOM signal and provides as input to the digital loop filter 12. The RANDOM signal represents a set of integer frequency divisions of the loop clock signal, FPLL. The divide-by-N circuit 14 and the RANDOM signal are discussed below in FIG. 11.

Figure 2:
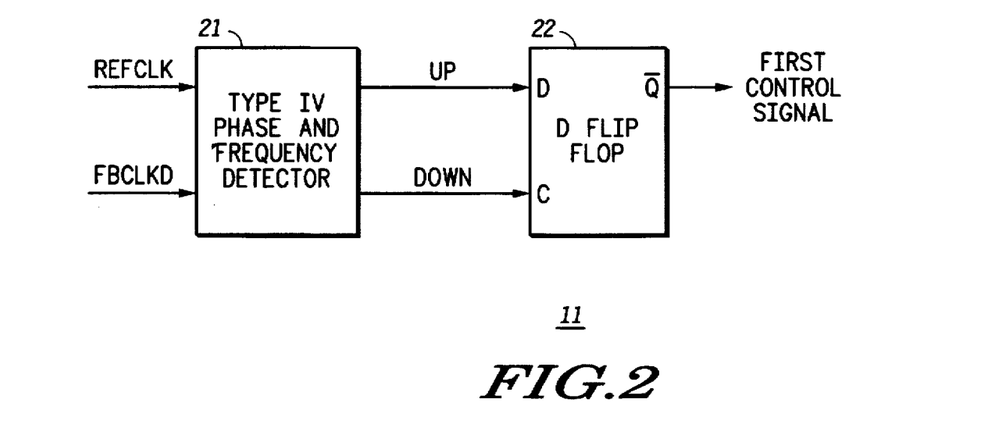
FIG. 2 depicts a block diagram of a first embodiment of a phase detector illustrated in FIG. 1.

FIG. 2 depicts a block diagram of a first embodiment of the phase detector 11 illustrated in FIG. 1. A Type IV phase and frequency detector 21 connects to a D Flip Flop 22. The Type IV phase and frequency detector 21 receives the reference clock signal, REFCLK, and the feedback delay clock signal, FBCLKD. The Type IV phase and frequency detector 21 generates two output signals, an UP signal and a DOWN signal. The UP signal is coupled to a data input, (D), of the D Flip Flop 22 and the DOWN signal is coupled to a clock input, (C), of the D Flip Flop 22. A complementary data output, (Q), of the D Flip Flop 22 generates the FCS.

In the operation of the phase detector 11, the Type IV phase and frequency detector 21 analyzes phase and frequency differences between the reference clock signal, REFCLK, and the feedback delay clock signal, FBCLKD. The UP signal and the DOWN signal represent the phase and frequency differences between the reference clock signal, REFCLK, and the feedback delay clock signal, FBCLKD. If the reference clock signal, REFCLK, rises then the UP signal rises. If the feedback delay clock signal, FBCLKD, rises then the DOWN signal rises. If the UP signal and the DOWN signal are both high at the same time, then both the UP signal and the DOWN signal decrease to logic zero. Otherwise, the UP signal and the DOWN signal retain their values.

The FCS is generated by comparing a rising edge of the UP signal with a rising edge of the DOWN signal. The FCS is the complement of the UP signal at the time of the DOWN signal transition from a logic zero to a logic one. For example, if the UP signal is a logic one as the DOWN signal transitions from a logic zero to a logic one, then FCS is a logic zero. If the UP signal is a logic zero as the DOWN signal transitions from a logic zero to a logic one, then the FCS is a logic one. Otherwise, the FCS retains its value.

Figure 3:
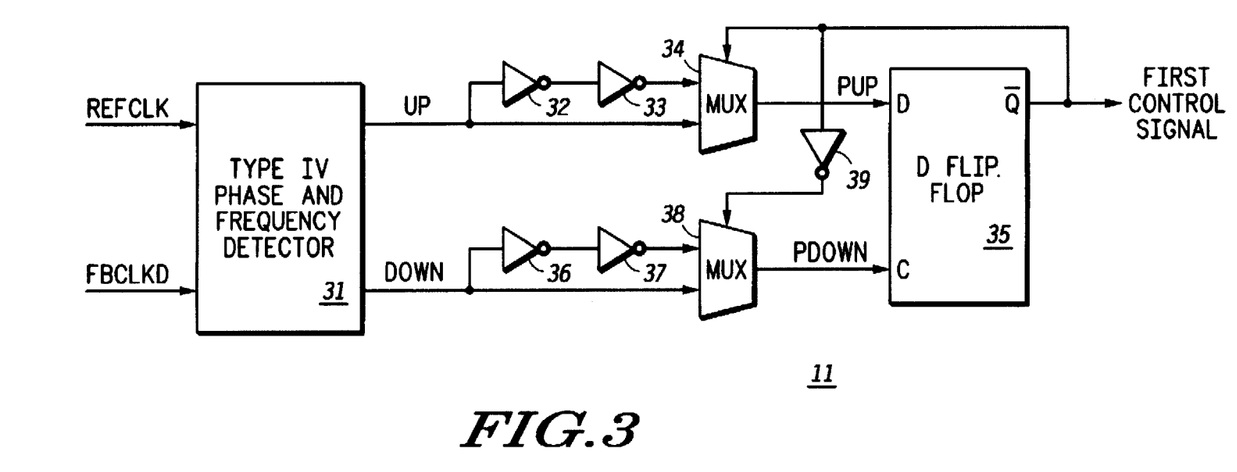
FIG. 3 depicts a block diagram of a second embodiment of the phase detector illustrated in FIG. 1.

FIG. 3 depicts a block diagram of a second embodiment of the phase detector 11 illustrated in FIG. 1. The Type IV phase and frequency detector 31 receives the reference clock signal, REFCLK, and the feedback delay clock signal, FBCLKD. The outputs of the Type IV phaase and frequency detector 31, the UP signal and the DOWN signal, are connected to a first 2:1 multiplexer ("mux", hereafter) 34 and to a second 2:1 mux 38, respectively. The UP signal connects to mux 34 in two different methods. First, the UP signal connects directly to a first input of mux 34. Second, the UP signal connects to an inverter 32. An output of the inverter 32 (an inverted and delayed version of the UP signal) connects to an input of an inverter 33. An output of the inverter 33 (a further delayed version of the UP signal) connects to a second input of mux 34. Similarly, the DOWN signal connects to mux 38 in two different methods. First, the DOWN signal connects directly to a first input of mux 38. Second, the DOWN signal connects to an inverter 36. An output of the inverter 36 (an inverted and delayed version of the DOWN signal) connects to an input of an inverter 37. An output of the inverter 37 (a further delayed version of the DOWN signal) connects to a second input of mux 38. In other embodiments, additional delay elements or inverters are added to or substituted for inverters 32, 33, 36 and 37.

An output of mux 34, a PUP signal, is coupled to a data input, (D), of a D Flip Flop 35. An output of mux 38, a PDOWN signal, is coupled to a clock input, (C), of the D Flip Flop 35. A complementary data output, (Q), of the D Flip Flop 35 generates the FCS. The FCS is provided to a select input of mux 34 and an input to inverter 39. An output of the inverter 39, a complement of the FCS, is provided to a select input of mux 38.

In the operation of the second embodiment phase detector 11, the Type IV phase and frequency detector 31 is similar to the Type IV phase and frequency detector 21 described above in FIG. 2. The FCS and the complement of the FCS, are provided to the select inputs of mux 34 and mux 38, respectively. Mux 34 selects either the direct connection of the UP signal or the connection through inverter 32 and inverter 33 of the UP signal. If the FCS is a logic high, mux 34 selects the direct connection, otherwise, mux 34 selects the connection through inverter 32 and inverter 33. Mux 38 selects either the direct connection of the DOWN signal or the connection through inverter 36 and inverter 37 of the DOWN signal. If the FCS is a logic high, mux 38 selects the connection through inverter 36 and inverter 37, otherwise, mux 38 selects the direct connection.

The output of mux 34 is the PUP signal, a representation of the UP signal. The PUP signal represents the UP signal as it propagates in either the direct connection or the connection through inverter 32 and inverter 33. The output of mux 38 is the PDOWN signal, a representation of the DOWN signal. The PDOWN signal represents the DOWN signal as it propagates in either the direct connection or the connection through inverter 36 and inverter 37. The FCS is generated by comparing the leading edge of the PUP signal with the leading edge of the PDOWN signal. When the PDOWN signal transitions from a logic zero to a logic one state, the FCS is the complement of the PUP signal at the time of the PDOWN signal transition. For example, if the leading edge of PDOWN signal occurs before the leading edge of PUP signal, then the FCS rises to a logic one when the PDOWN signal transitions from logic zero to logic one. If the PDOWN signal is a logic zero, then the FCS retains its value.

The FCS and the complement of the FCS are provided to the select inputs of mux 34 and mux 38, respectively. Therefore, a feedback loop exists between the output of the D Flip Flop 35 and the inputs to the D Flip Flop 35. If the leading edge of the PUP signal rises before the leading edge of the PDOWN signal rises, the FCS is a logic zero. In this case, mux 34 selects the delay path through inverter 32 and inverter 33 of the UP signal and mux 38 selects the direct connection of the DOWN signal. The preceding configuration results in delaying the PUP signal relative to the PDOWN signal, increasing the probability the next PUP signal leading edge occurs after the next PDOWN signal leading edge. Therefore, the FCS is biased toward a change of state from a logic zero to a logic one. Conversely, if the leading edge of the PUP signal rises after the leading edge of the PDOWN signal rises, the FCS is a logic one. In this case, mux 38 selects the delay path through inverter 36 and inverter 37 of the DOWN signal and mux 34 selects the direct connection of the UP signal. The preceding configuration results in delaying the PDOWN signal relative to the PUP signal, increasing the probability the next PUP signal leading edge occurs before the next PDOWN signal leading edge. Therefore, the FCS is biased toward a change of state from a logic one to a logic zero. The preceding method of biasing the FCS to change states, decreases the frequency error of the loop clock signal, FPLL.

Figure 4:
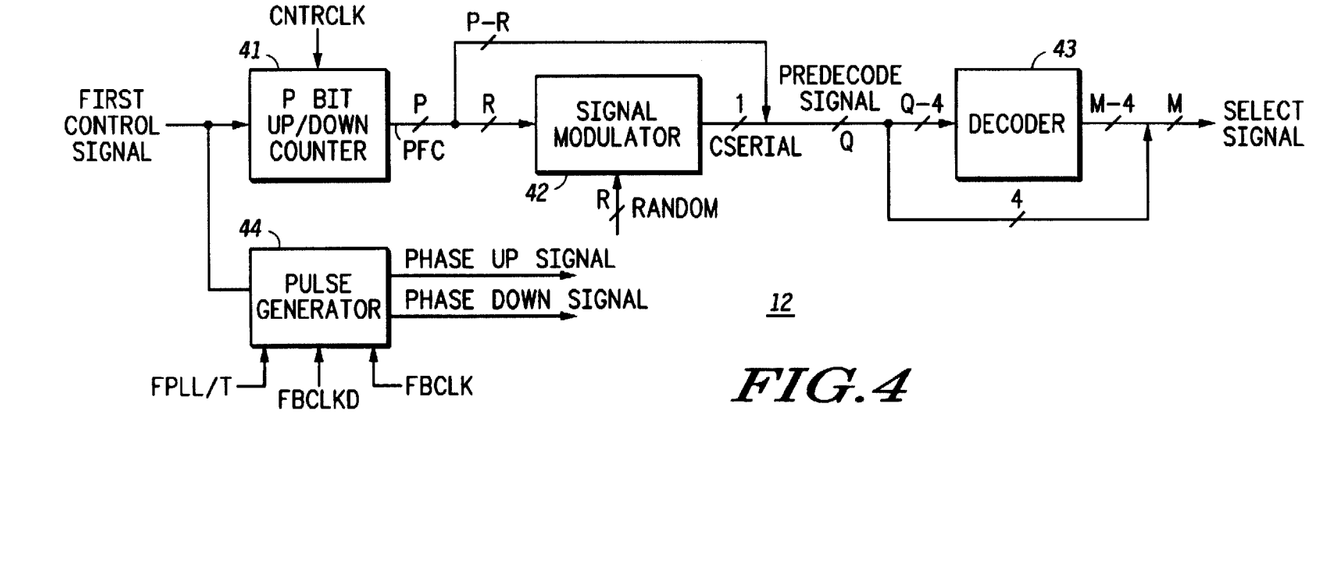
FIG. 4 depicts a block diagram of a digital loop filter illustrated in FIG. 1.

FIG. 4 depicts a block diagram of the digital loop filter 12 illustrated in FIG. 1. FIG. 4 depicts a P bit up/down counter 41, a signal modulator 42, a decoder 43, and a pulse generator 44. The P bit up/down counter 41 ("counter", hereafter, where P is an integer) receives the FCS and a counter clock signal, CNTRCLK. The counter 41 outputs a processed first control signal ("PFC signal", hereafter) containing P bits. The signal modulator 42 receives the least significant R bits (where R is an integer less than or equal to P) of the PFC signal and the R bit RANDOM signal from the divide-by-N circuit 14. The remaining P-R bits of the PFC signal bypass the signal modulator 42. The signal modulator 42 generates a one bit CSERIAL signal. The CSERIAL signal combines with the P-R bits bypassing the signal modulator 42 forming a PREDECODE signal containing Q bits (where Q is an integer). The decoder 43 receives the most significant Q-4 bits of the PREDECODE signal. The remaining four least significant bits of the PREDECODE signal bypass the decoder 43. The decoder 43 generates M-4 bits (where M is an integer) and combines with the four least significant bits of the PREDECODE signal resulting in the SELECT SIGNAL containing M bits.

The pulse generator 44 receives the FCS, the division of the loop clock signal, FPLL/T, the feedback clock signal, FBCLK, and the feedback delay clock signal, FBCLKD. The pulse generator 44 generates the PHASE UP SIGNAL and the PHASE DOWN SIGNAL. The SELECT SIGNAL controls the frequency of the loop clock signal, FPLL. The PHASE UP SIGNAL and the PHASE DOWN SIGNAL are phase correction signals and control the phase of the loop clock signal, FPLL, in the digital controlled oscillator 13. The pulse generator, the PHASE UP SIGNAL and the PHASE DOWN SIGNAL are discussed below in FIG. 5. The generation of the feedback clock signal, FBCLK, is discussed below in FIG. 11.

The counter 41 represents a state machine performing a mathematical operation analogous to a capacitor in an analog loop. In an analog loop filter, a capacitor integrates a charge pump current from an analog PLL phase detector. The counter 41 is a state machine initially containing a predetermined value. In this embodiment, counter 41 sequentially increments or decrements its contents based on the FCS and the counter clock signal, CNTRCLK. A D Flip Flop with a feedback delay clock, FBCLKD, provided as a data input, (D), and the loop clock signal, FPLL, provided as a clock input, (C), generates the counter clock signal, CNTRCLK. The counter 41 increments its contents one unit when the FCS corresponds to a logic one upon the rising edge of the counter clock signal, CNTRCLK. Counter 41 decrements its contents one unit when the FCS corresponds to a logic zero upon the rising edge of the counter clock signal, CNTRCLK. The signal modulator 42 receives the least significant R bits of the PFC signal. The signal modulator 42 receives the R bit RANDOM signal, representing a set of integer frequency divisions of the loop clock signal, FPLL. The signal modulator 42 outputs the one bit CSERIAL signal and by combining with the P-R bits (which bypass the signal modulator 42) forms the PREDECODE signal containing Q bits (Q=P-R+1). The CSERIAL signal is the least significant bit of the PREDECODE signal. The decoder 43 receives the most significant Q-4 bits of the PREDECODE signal and the least significant four bits of the PREDECODE signal bypass the decoder 43. In this embodiment, P=16, R=9, Q=8, M=15. The decoder 43 utilizes a non conventional scheme discussed below in FIG. 6.

In other embodiments, the signal modulator 42 may receive all P bits from the counter 41 or the signal modulator 42 outputs the CSERIAL signal containing more than one bit or both. In other embodiments, the decoder 43 may receive all Q bits from the PREDECODE signal. The amount of bits the signal modulator 42 or decoder 43 receives depends on the application, processing speed, resolution, and power consumption. A graphics intensive application requires more bits and consumes more power than a portable cellular phone with a low operating frequency.

In other embodiments, the signal modulator 42 may be removed or the decoder 43 may be removed or both. If the signal modulator 42 is removed, the decoder 43 receives the output of the counter 41 or the counter 41 generates the PFC signal and provides as input to the digital controlled oscillator 13. If the decoder 43 is removed, the digital controlled oscillator 13 receives the PREDECODE signal from the signal modulator 42. In yet another embodiment, the pulse generator 44 may be removed and the functionality achieved by modifying the P bit up/down counter 41.

Figure 5:
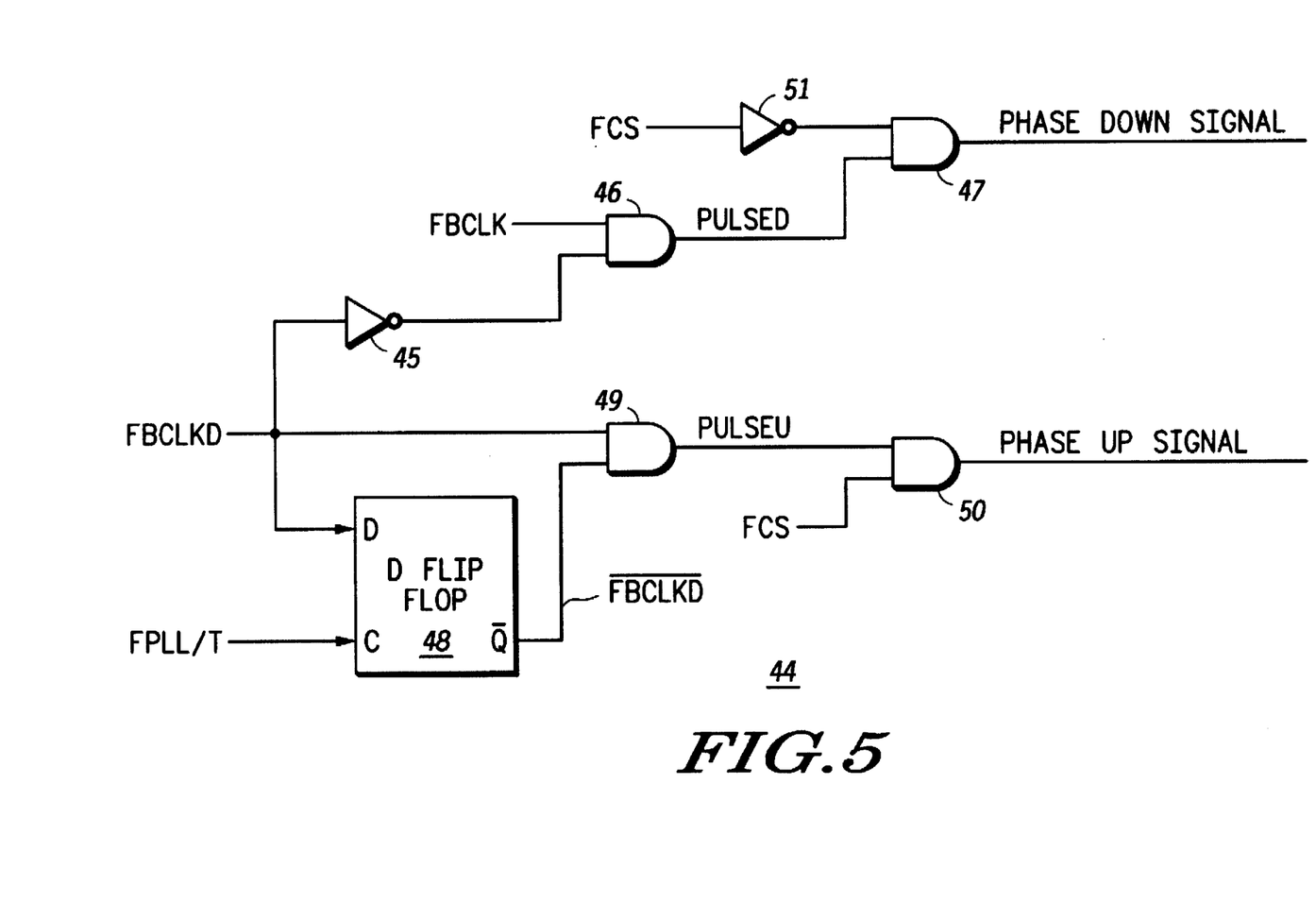
FIG. 5 depicts a pulse generator illustrated in FIG. 4.

FIG. 5 depicts a pulse generator 44 illustrated in FIG. 4. The pulse generator 44 receives the feedback delay clock signal, FBCLKD, and a division of the loop clock signal FPLL/T, where T is an integer. In this embodiment, T is 20. This division of the loop clock signal, FPLL/T, is performed by a series of inverters and D Flip Flops in the divide-by-N circuit 14 and is discussed below in FIG. 11. The feedback delay clock signal, FBCLKD, is coupled to an input of an inverter 45, an input of an AND gate 49, and a data input, (D), of a D Flip Flop 48. The feedback clock signal, FBCLK, is coupled to an input of an AND gate 46. An output of inverter 45 is coupled to a second input of the AND gate 46. An output of the AND gate 46, a PULSED signal, is coupled to an input of an AND gate 47. The FCS is coupled to an input of inverter 51. An output of inverter 51 is coupled to a second input of the AND gate 47. An output of the AND gate 47 generates the PHASE DOWN SIGNAL. The division of the loop clock signal FPLL/T is coupled to a clock input, (C), of the D Flip Flop 48. A complementary data output, ($\overline{Q}$), of the D Flip Flop 48, generates a complement of the feedback delay clock signal, $\overline{\text{FBCLKD}}$. The complement of the feedback delay clock signal, $\overline{\text{FBCLKD}}$, is coupled to a second input of the AND gate 49. An output of the AND gate 49 generates a PULSEU signal. The PULSEU signal is coupled to an input of an AND gate 50. The FCS is coupled to a second input of the AND gate 50. An output of the AND gate 50 generates the PHASE UP SIGNAL.

The pulse generator 44 outputs the PHASE UP SIGNAL and the PHASE DOWN SIGNAL. The PHASE UP SIGNAL and the PHASE DOWN SIGNAL control the phase of the loop clock signal, FPLL, in the digital controlled oscillator 13. PULSEU and PULSED gate the FCS and the logical complement of the FCS, respectively, each FBCLKD cycle. These two clock pulses straddle the rising edge of FBCLKD. Each one lasts for a period defined by FPLL/T. Consequently, one or none of the PHASE DOWN SIGNAL and the PHASE UP SIGNAL will be active at a time. When active, each one will last for the period, FPLL/T. Whether each one is active at the appropriate time will depend upon the value of the FCS at the time. For instance, if the FCS is a logic zero when the corresponding gating signal PULSED signal is active, then PHASE DOWN SIGNAL will be active. Later, if the FCS is still a logic zero when the second corresponding gating signal PULSEU signal is active, then PHASE UP SIGNAL will be inactive.

The magnitude of the phase adjustment, both positive and negative, can be varied to suit the application in which PLL 10 is incorporated. For instance, if a greater adjustment is required to match process variations in digital controlled oscillator 13, then the value of T could be increased to extend the time in which the PHASE DOWN SIGNAL and the PHASE UP SIGNAL are asserted.

Figure 6:
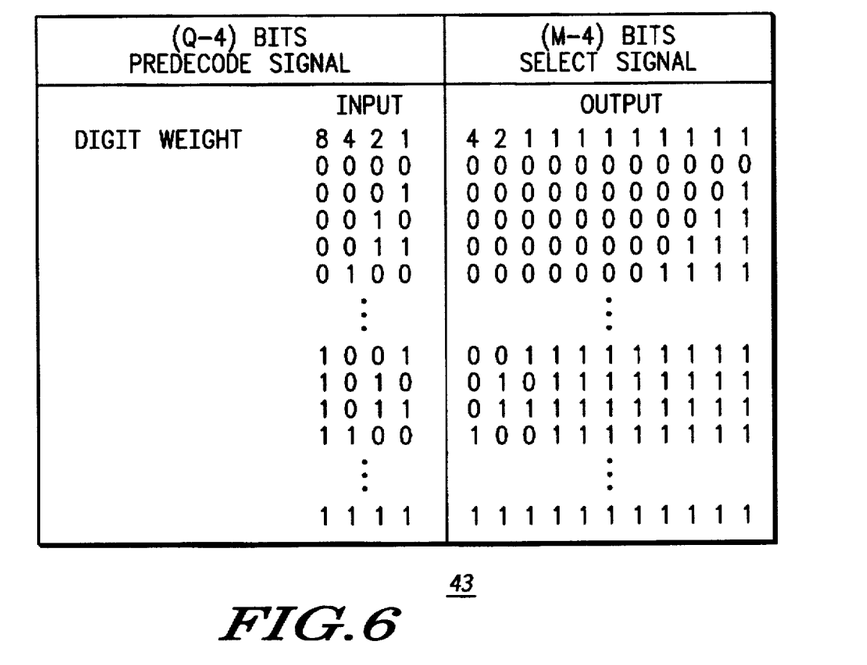
FIG. 6 depicts in tabular form, a decode example used in a decoder illustrated in FIG. 4.

FIG. 6 depicts, in tabular form, a decode example of the decoder 43 illustrated in FIG. 4. The example shows the input to the decoder 43, the PREDECODE signal (Q-4 bits) at left, and the corresponding output signal, SELECT SIGNAL (M-4 bits) at the right. The PREDECODE signal (Q-4 bits) is in the form of a digit weight scheme of 8421 base 10. The SELECT SIGNAL (M-4 bits) is calculated using a non-conventional scheme of 42111111111 base 10. The preceding decode utilizing the non-conventional scheme limits the effect of the delay element mismatch in the digital controlled oscillator 13 by limiting the number of delay element exchanges for adjacent values of the SELECT SIGNAL. In other embodiments, different decode schemes are possible, or decoding is not required and the decoder 43 is excluded.

Figure 7:
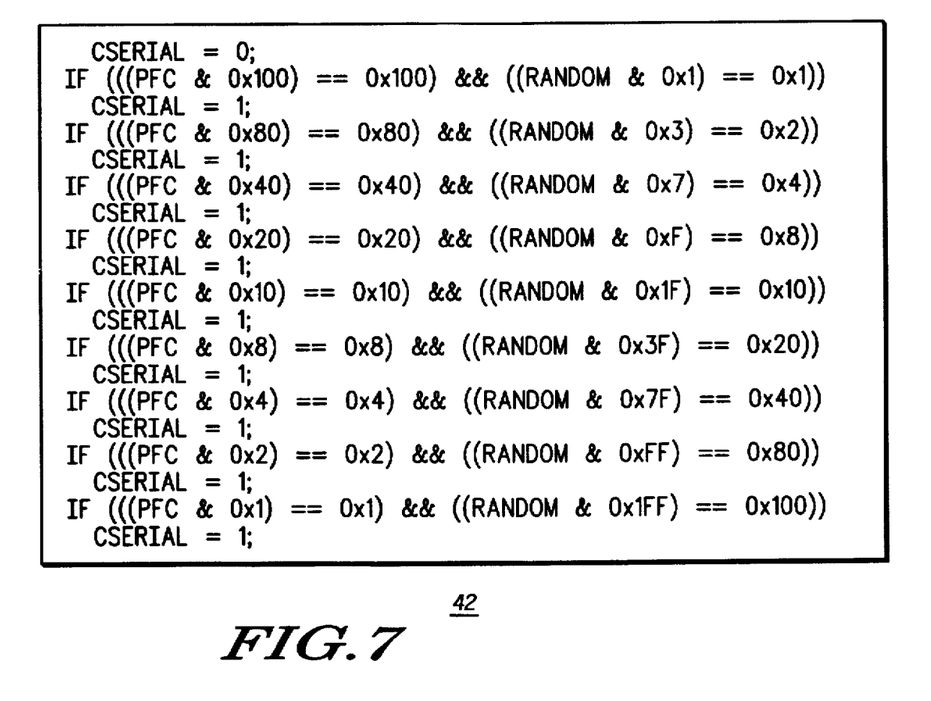
FIG. 7 depicts in mathematical form, the operation and synthesis of a signal modulator illustrated in FIG. 4.

FIG. 7 depicts in mathematical form the operation and synthesis of the signal modulator 42 depicted in FIG. 4. A computer aided design (CAD) synthesis program synthesizes the mathematical expression generating the signal modulator 42 depicted in FIG. 8. The synthesis program translates the logic expressed in the mathematical expression in FIG. 7 into the logic gates depicted in FIG. 8. The mathematical expression is presented in the format of a C language program known in the art. The CSERIAL signal is set to a low logic value unless one of the 9 If Then statements is true.

Figure 8:
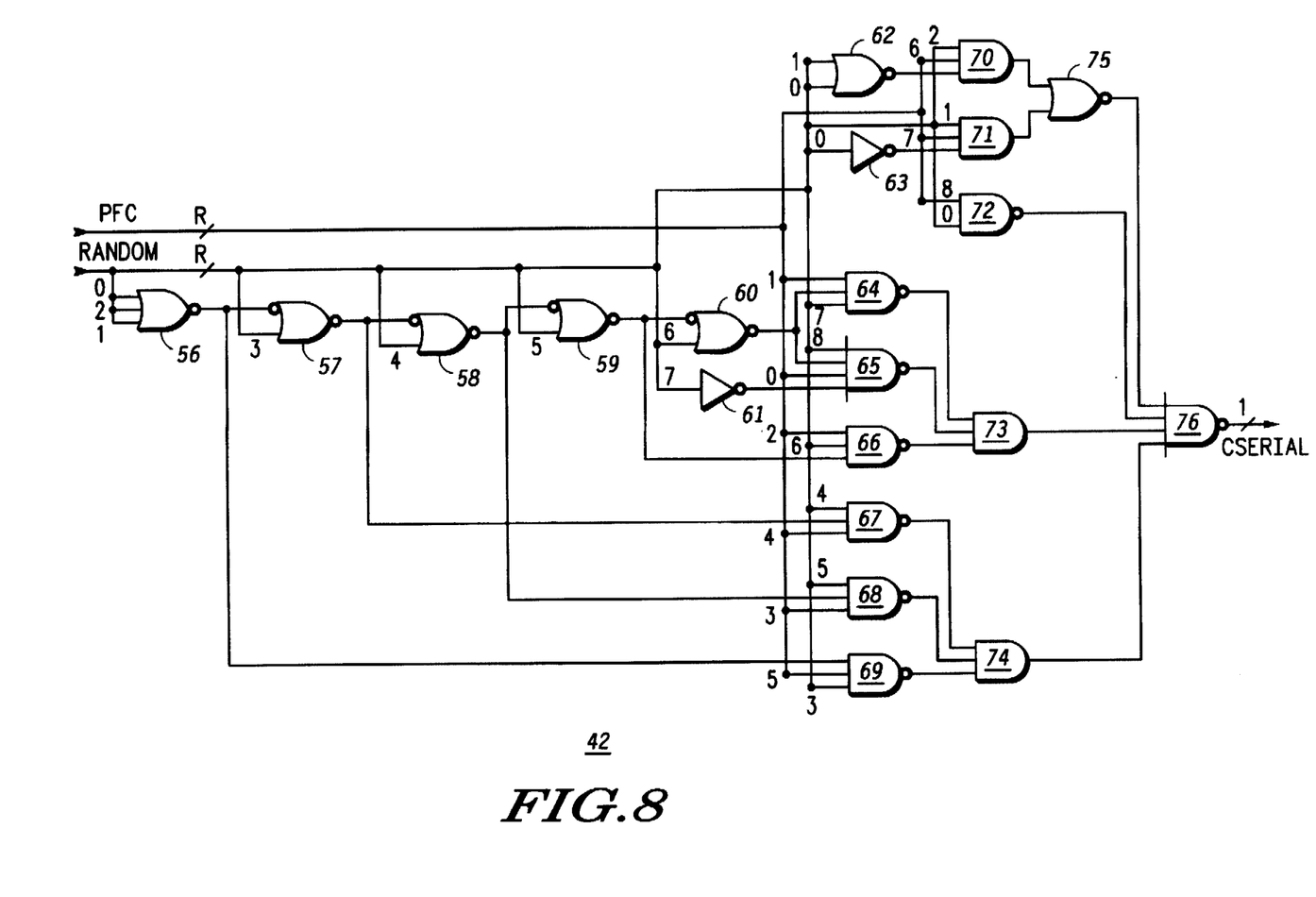
FIG. 8 depicts a circuit diagram of a signal modulator illustrated in FIG. 4.

FIG. 8 depicts a circuit diagram of the signal modulator 42 illustrated in FIG. 4. The signal modulator 42 receives the PFC signal and the RANDOM signal from the divide-by-N circuit 14. The signal modulator 42 generates the CSERIAL signal. The circuit of the signal modulator 42 is generated from the mathematical expression in FIG. 7. A NOR gate 56 receives three bits 0,1,2 from the RANDOM signal. A NOR gate 57 receives the output of the NOR gate 56 and a bit 3 from the RANDOM signal. A NOR gate 58 receives an output of the NOR gate 57 and a bit 4 from the RANDOM signal. A NOR gate 59 receives an output of the NOR gate 58 and a bit 5 from the RANDOM signal. A NOR gate 60 receives an output of the NOR gate 59 and a bit 6 from the RANDOM signal. An inverter 61 receives a bit 7 from the RANDOM signal. A NOR gate 62 receives two bits 0,1 from the RANDOM signal. An inverter 63 receives a bit 0 from the RANDOM signal. A NAND gate 64 receives the following inputs: an output of the NOR gate 60, bit 7 from the RANDOM signal, bit 1 from the PFC signal. A NAND gate 65 receives the following inputs: the output of the NOR gate 60, bit 8 from the RANDOM signal, bit 0 from the PFC signal. A NAND gate 66 receives the following inputs: the output of the NOR gate 59, bit 6 from the RANDOM signal, bit 2 from the PFC signal. A NAND gate 67 receives the following inputs: the output of the NOR gate 57, bit 4 from the RANDOM signal, bit 4 from the PFC signal. A NAND gate 68 receives the following inputs: the output of the NOR gate 58, bit 5 from the RANDOM signal, bit 3 from the PFC signal. A NAND gate 69 receives the following inputs: the output of the NOR gate 56, bit 3 from the RANDOM signal, bit 5 from the PFC signal. An AND gate 70 receives the following inputs: an output of the NOR gate 62, bit 2 from the RANDOM signal, bit 6 from the PFC signal. An AND gate 71 receives the following inputs: an output of the inverter 63, bit 1 from the RANDOM signal, bit 7 from the PFC signal. A NAND gate 72 receives bit 0 from the RANDOM signal and bit 8 from the PFC signal. An AND gate 73 receives the following: an output of the NAND gate 64, an output of the NAND gate 65, an output of the NAND gate 66. An AND gate 74 receives the following: an output of the NAND gate 67, an output of the NAND gate 68, an output of the NAND gate 69. A NOR gate 75 receives an output of the AND gate 70 and the output of the AND gate 71. An NAND gate 76 receives the following: an output of the NOR gate 75, an output of the NAND gate 72, an output of the AND gate 73, an output of the AND gate 74. An output of NAND gate 76 generates the CSERIAL signal.

In operation, signal modulator 42 reduces the quantization error between the phase of the reference clock signal, REFCLK, and the loop clock signal, FPLL. As described elsewhere, signal modulator 42 can advance or retard the phase of the loop clock signal, FPLL, by engaging or disengaging one or more delay elements in the digital controlled oscillator 13. Signal modulator 42 adjusts the phase of the loop clock signal, FPLL, many times during each cycle of the feedback delay clock, FBCLKD. In the described embodiment, signal modulator 42 samples the PFC signal approximately one-thousand times per cycle of the reference clock, REFCLK. The digital controlled oscillator 13 adjusts the phase of the loop clock signal, FPLL, by engaging the delay elements for a fraction of the period of the feedback delay clock, FBCLKD, corresponding to the necessary phase adjustment. In the steady state condition, the signal modulator 42 engages and disengages a single delay element many times during each cycle of the feedback delay clock, FBCLKD. Therefore, the signal modulator 42 is able to maintain a near zero phase difference between the reference clock signal, REFCLK, and the loop clock signal, FPLL, over both a large and a small time interval. A "large" time interval corresponds to the period of the feedback delay clock, FBCLKD. A "small" time interval corresponds to the period of the loop clock signal, FPLL.

Conversely, PLL 10 would only be able to engage or disengage the same delay element in the digital controlled oscillator 13 for an entire cycle of the feedback delay clock signal, FBCLKD, if the signal modulator 42 were omitted. In this case, the phase of the loop clock signal, FPLL, would vary significantly from the phase of the reference clock signal, REFCLK, over a small time interval. The phase of the loop clock signal, FPLL, would follow the phase of the reference clock signal, REFCLK, over a large time interval.

Continuing with FIGS. 7 and 8, the signal modulator 42 asserts the CSERIAL signal for the portion of the period of the feedback delay clock, FBCLKD, indicated by the R least significant bits ("LSBs", hereafter) of the PFC signal, considering the most significant of these bits as having a value of 0.5. Signal modulator 42 evenly spreads the assertion of CSERIAL over the entire period of the feedback delay clock, FBCLKD. In general, signal modulator 42 passes a particular bit of the R LSBs of PFC during the active period of one of R corresponding clock signals, derived from RANDOM. These R passed/blocked bits are OR'ed together to generate CSERIAL. As described below in connection with FIG. 11, the ith one of the R RANDOM signals has a frequency half that of the (ith-1) RANDOM signal. The program of FIG. 7 and the circuit of FIG. 8 further qualify these RANDOM signals before they are gated with the R LSBs of PFC. Specifically, the ith clock signal is generated by logically AND'ing (1) the ith RANDOM signal and (2) the complement of the logical OR of RANDOM signals (i=1, . . . , i=i−1). The ith one of these qualified clock signals has the same frequency as the ith one of the RANDOM signals. However, the ith one of the qualified clock signal is active for only $(½^i)$*period and inactive for $(1-(½^i))$*period. Consequently, each of the R qualified clock signals is active at a unique time during each period of the feedback delay clock, FBCLKD. For example, signal modulator 42 "passes" the most significant bit of PFC during the asserted portion RANDOM(1). (RANDOM(1) is not modified before it gates the MSB of PFC.) Signal modulator 42 "passes" the second most significant bit of PFC during a clock signal which is active one-fourth of the time. The asserted portion of this second clock signal occurs during every second inactive portion of RANDOM(1). Signal modulator 42 "passes" the third most significant bit of PFC during a clock signal which is active one-eighth of the time. The asserted portion of this third clock signal occurs during every fourth inactive portion of RANDOM(1).

The described signal modulator 42 may be implemented as a software routine by a general purpose computer, microcontroller, digital signal processor. The signal modulator 42 performs the mathematical expression in FIG. 7. The mathematical expression modulates the PFC signal with the RANDOM signal by checking the most significant bit of the PFC signal for a logic one and checking the least significant bit of the RANDOM signal for a logic one. Simultaneously, the signal modulator 42 checks the next most significant bit of the PFC signal for a logic one and checks the next least significant bit of the RANDOM signal for a logic one. This iteration continues and results in checking the least significant bit of the PFC signal for a logic one and checking the most significant bit of the RANDOM signal for a logic one. If any of the checking conditions are true, the CSERIAL signal is set to a logic one. The data rate of the CSERIAL signal is faster than the data rate of the PFC signal.

The design of signal modulator 42 makes its suitable for applications in which phase error is critical over all time domains. Also, low frequency noise caused by the periodic engaging and disengaging of delay elements can be shifted to higher frequency domains. Typically, these higher frequency domains can be chosen to not interfere with the operation of a particular application. The higher time domains are selected by the sampling rate of signal modulator 42. In other embodiments, the RANDOM signal is not needed or a sigma delta substitutes for the signal modulator 42.

Figure 9:
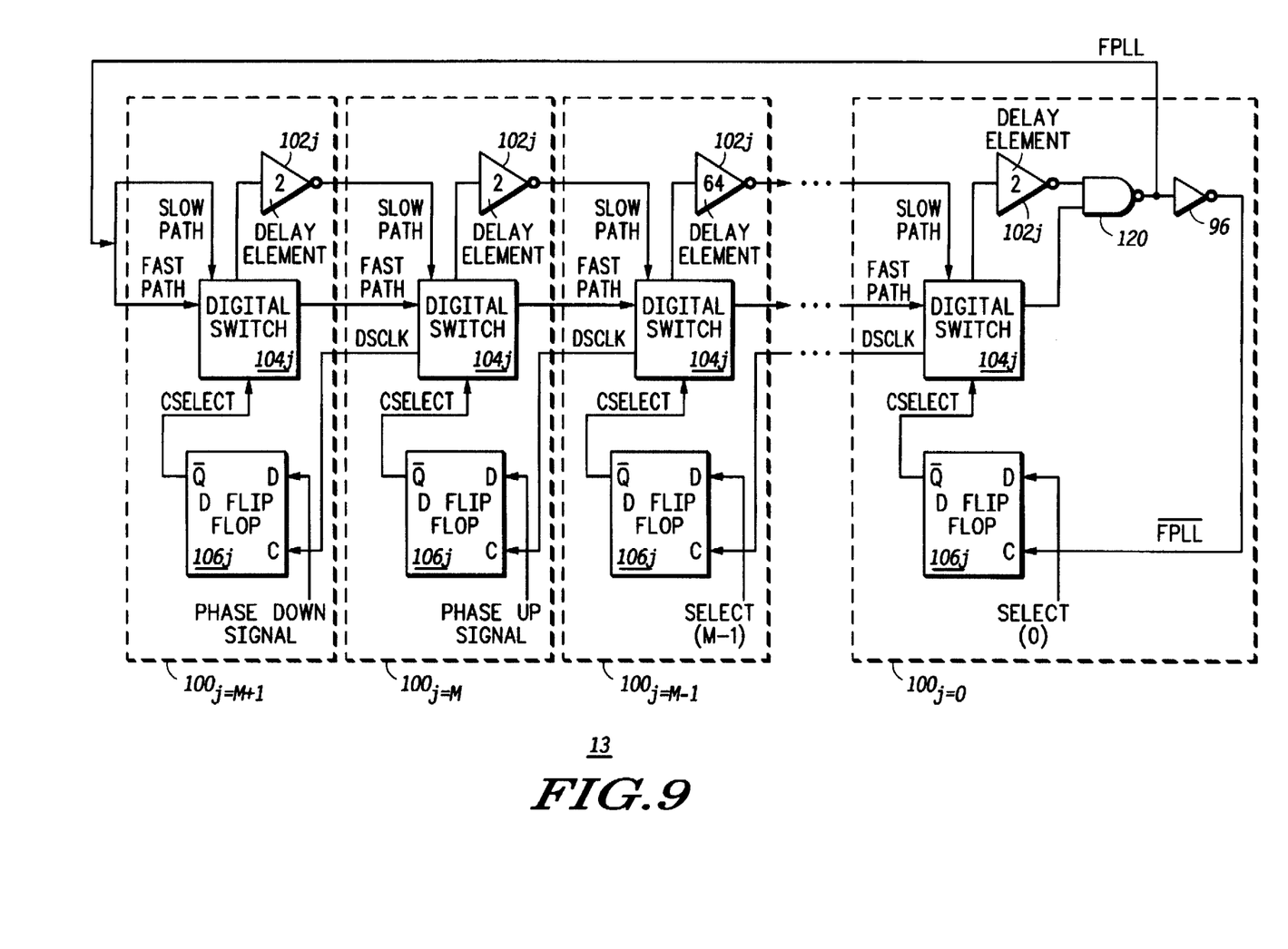
FIG. 9 depicts a block diagram of a digital controlled oscillator illustrated in FIG. 1.

FIG. 9 depicts a block diagram of the digital controlled oscillator 13 illustrated in FIG. 1. The SELECT SIGNAL, the PHASE UP SIGNAL and the PHASE DOWN SIGNAL are inputs to the digital controlled oscillator 13. The digital controlled oscillator 13 contains (M+2) Programmable Delay Elements $100_j$ coupled in series with a NAND gate 120 and an inverter 96 to form a ring oscillator (where j is an integer index ranging from 0 to M+1). Each Programmable Delay Element $100_j$ ("PDE", hereafter) contains a delay element $102_j$, a digital switch $104_j$ and a D Flip Flop $106_j$. The frequency and phase of the ring oscillator is a function of the SELECT SIGNAL, the PHASE UP SIGNAL and the PHASE DOWN SIGNAL and the amount of delay through each PDE $100_j$. The delay through each PDE $100_j$ is programmable. Therefore, the loop clock signal, FPLL, is digitally controllable.

Each PDE $100_j$ receives a clock signal, DSCLK, from the digital switch $104_{(j-1)}$ at the clock input, (C), of D Flip Flop $106_j$ except for j=0. In the case of j=0, the DSCLK signal is received at the clock input, (C), of D Flip Flop $106_j$ from an output of an inverter 96. The inverter 96 receives an output of the NAND gate 120. The NAND gate 120 receives an output of a delay element $102_j$=0 and the OUTFAST output of digital switch $104_j$=0. An output of the NAND gate 120 generates the loop clock signal, FPLL. Each digital switch $104_j$ receives at a SLOW PATH input an OUTSLOW output of the j+1 delay element $102_j$ except for the case of j=M+1. Each digital switch $104_j$ receives at a FAST PATH input an OUTFAST output of the j+1 digital switch $104_j$ except for the case of j=M+1. In the case of j=M+1, the digital switch $104_j$ receives the loop clock signal, FPLL, at the FAST PATH input and the SLOW PATH input. In other embodiments, multiple delay elements $102_j$ can be used for each digital switch $104_j$.

Each PDE $100_j$ receives at a data input, (D), of the D Flip Flop $106_j$ one bit (the corresponding jth bit) of the SELECT SIGNAL except for the case of j=M and j=M+1. The least significant bit of the SELECT SIGNAL is provided to the data input, (D), of the D Flip Flop $106_j$ where j=0. The most significant bit of the SELECT SIGNAL is provided to the data input, (D), of the D Flip Flop $106_j$ where j=M−1. In the case of j=M, the PHASE UP SIGNAL is provided to the data input, (D), of the D Flip Flop $106_j$. In the case of j=M+1, the PHASE DOWN SIGNAL is provided to the data input, (D), of the D Flip Flop $106_j$. The delay elements $102_j$ have different amounts of delay. In the case of j=M, and j=M+1, the delay elements $102_j$ are two inverters in series. In the case of j=M−1 down to j=0, the delay element $102_j$ is 2*(32,4,2,1,4,2,1,1,1,1,1,1,1,1,1) inverters in series, respectively.

In other embodiments, digital switch $104_j$ receives at the OUTSLOW input, the SLOW PATH output of a plurality of delay elements $102_j$. In other embodiments, delay element $102_j$ can have one or more digital logic gates, buffers, capacitors, and current sources in different configurations. The present embodiment can be altered to receive digital and analog signals in applications requiring analog and digital components. In such an embodiment, an analog charge pump may be substituted for the signal modulator 42. In such an embodiment, an analog to digital converter (ADC) would connect to the output of the analog charge pump and provides digital signals to the digital controlled oscillator 13. In yet another embodiment an analog oscillator such has a voltage controlled oscillator (VCO) or a current controlled oscillator (CCO), could be substituted for the digital controlled oscillator 13. A digital to analog converter (DAC) connects to the output of the signal modulator 42. The DAC provides analog signals to the VCO or CCO. One embodiment excludes the decoder 43 or the divide-by-N circuit 14, or both.

The clocking architecture updates the frequency of the loop clock signal, FPLL, every period of the loop clock signal, FPLL. The delay in each PDE $100_j$ is programmable between the FAST PATH and SLOW PATH. Therefore, the frequency of the loop clock signal, FPLL, is digitally controlled.

Figure 10:
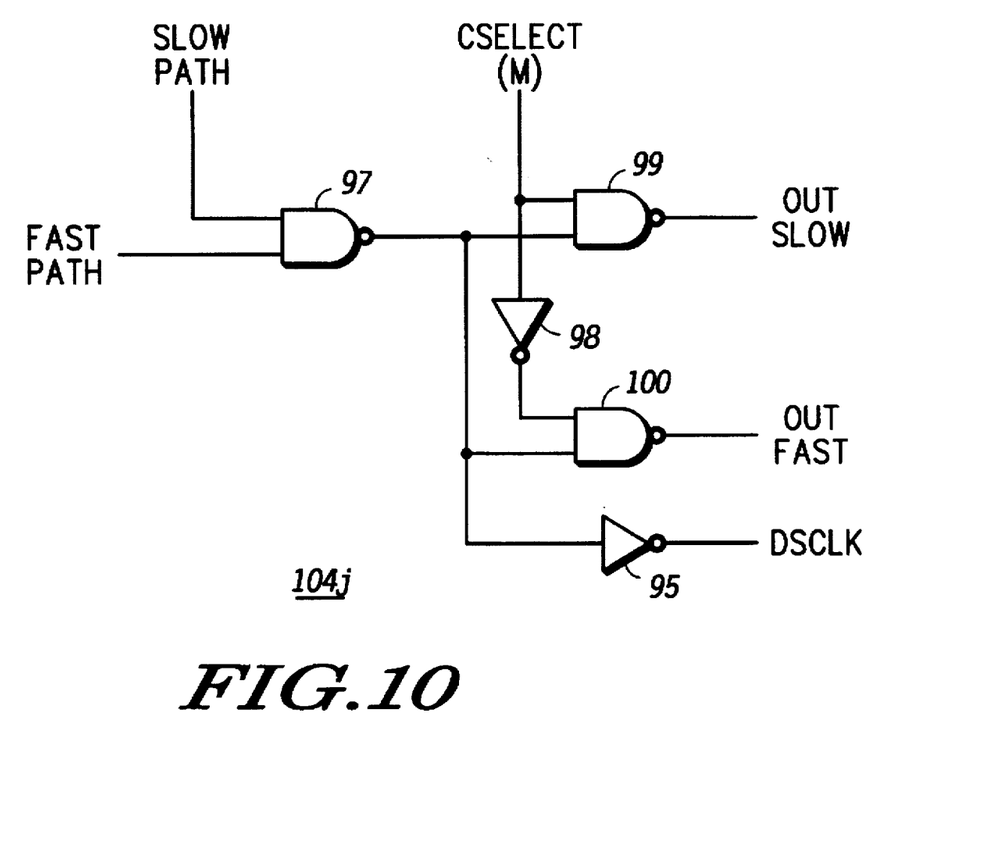
FIG. 10 depicts a circuit diagram of a digital switch illustrated in FIG. 9.

FIG. 10 depicts a circuit diagram of a digital switch illustrated in FIG. 8. The SLOW PATH SIGNAL and the FAST PATH SIGNAL are provided as inputs of a NAND gate 97. The CSELECT signal and an output of the NAND gate 97 are provided as inputs of a NAND gate 99. The output of the NAND gate 97 is provided as an input of inverter 95. An output of the inverter 95 generates the DSCLK signal. An inverter 98 receives the CSELECT signal and outputs a complement of the CSELECT signal. The output of the inverter 98 and the output of the NAND gate 97 are inputs to a NAND gate 100. The NAND gate 100 outputs the OUTFAST signal and the NAND gate 99 outputs the OUTSLOW signal. The CSELECT signal selects the FAST PATH or SLOW PATH to the next digital switch 104$_j$.

Figure 11:
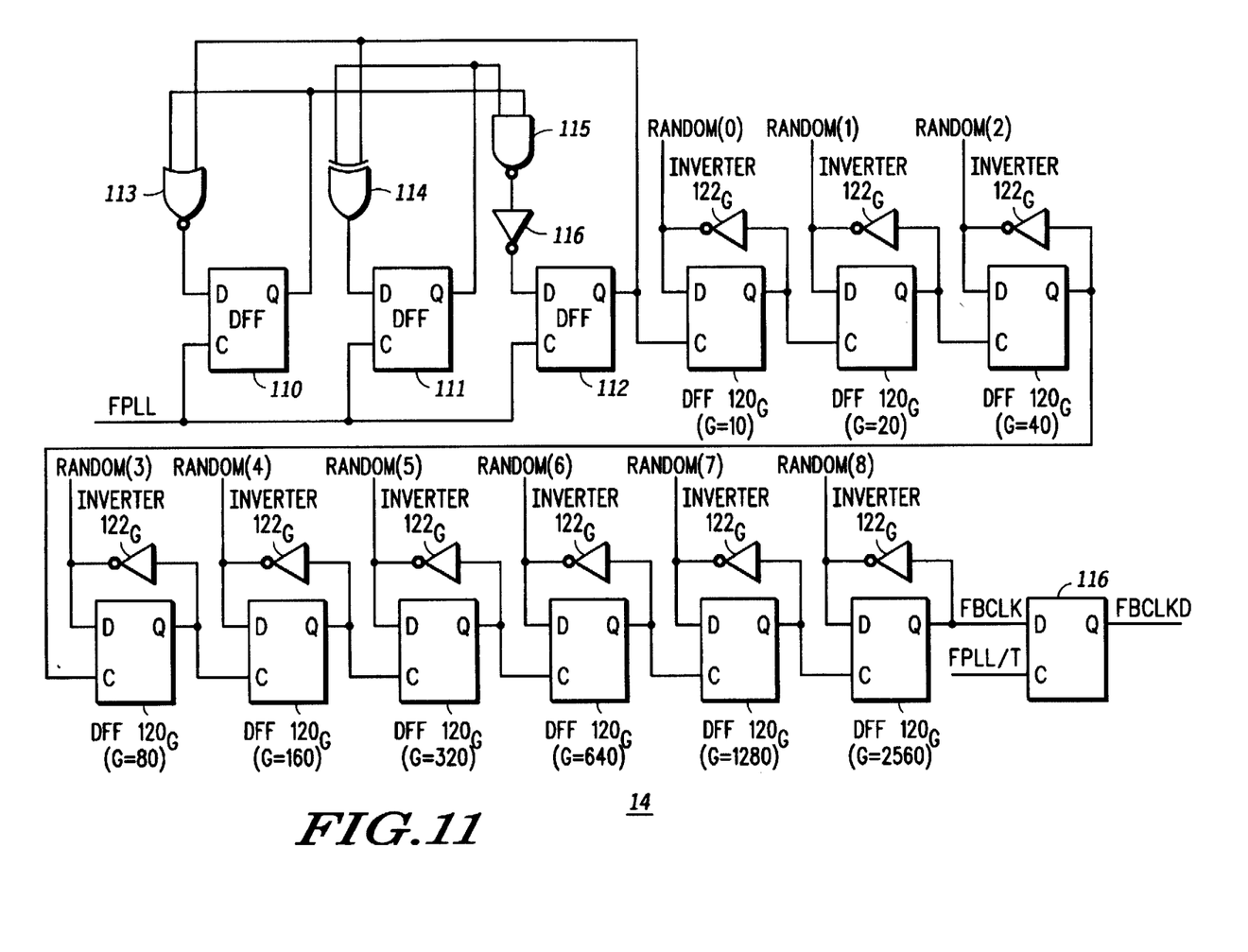
FIG. 11 depicts a circuit diagram of a divide-by-N circuit illustrated in FIG. 1.

FIG. 11 depicts a circuit diagram of the divide-by-N circuit 14 illustrated in FIG. 1. The divide-by-N circuit 14 receives the loop clock signal, FPLL, and generates the R (where R is an integer) bit RANDOM signal and the feedback delay clock signal, FBCLKD. The RANDOM signal is input to the signal modulator 42 and the feedback delay clock signal, FBCLKD, is input to the phase detector 11. The loop clock signal, FPLL, is coupled to a clock input, (C), of the following: a D Flip Flop 110, a D Flip Flop 111, and a D Flip Flop 112. A data output, (Q), of the D Flip Flop 110 is coupled to an input of a NOR gate 113 and is coupled to an input of a NAND gate 115. A data output, (Q), of the D Flip Flop 111 is coupled to an input of an XOR gate 114 and is coupled to a second input of the NAND gate 115. A data output, (Q), of the D Flip Flop 112 is coupled to a second input of the NOR gate 113 and is coupled to a second input of the XOR gate 114.

The data output, (Q), of the D Flip Flop 112 is coupled to a clock input, (C), of a D Flip Flop 120$_G$, with G=10, (where G is an integer index starting with 10 and increasing by multiples of 2 up to 2560). The data output, (Q), of the D Flip Flop 112 generates a frequency division of 5 on the loop clock signal, FPLL. A data output, (Q), of the D Flip Flop 120$_G$ is coupled to an input of an inverter 122$_G$, and is also coupled to a clock input of the D Flip Flop 120$_G$ (where G=20). An output of the inverter 122$_G$ (where G=10) is an input to a data input, (D), of the D Flip Flop 120$_G$ (where G=10). The output of the inverter 122$_G$ represents the least significant bit of the RANDOM signal. The division of the loop clock signal, FPLL/T, is generated at the same time as the RANDOM signal. For example, the inverter 122$_G$ (G=10) generates FPLL/10 and RANDOM(0), inverter 122$_G$ (G=20) generates FPLL/20 and RANDOM(1), etc. The connections for the remaining D Flip Flop 120$_G$ are similar to the connections of D Flip Flop 120$_G$ (where G=10). Each D Flip Flop 120$_G$ receives a clock input, (C), from a data output, (Q), of a preceding D Flip Flop 120$_G$. An output of each inverter 122$_G$ is the data input, (D), of each D Flip Flop 120$_G$. The output of each inverter 122$_G$ represents a bit of the RANDOM signal. The output of inverter 122$_G$ (where G=2560) generates the most significant bit of the RANDOM signal. The output of D Flip Flop 120$_G$ (where G=2560) generates a feedback clock signal, FBCLK. A data output, (Q), of D Flip Flop 120$_G$(where G=2560) is coupled to a data input, (D), of a D Flip Flop 116. The division of the loop clock signal, FPLL/T, is coupled to a clock input, (C), of the D Flip Flop 116. A data output, (Q), of the D Flip Flop 116 generates the feedback delay clock signal, FBCLKD.

In the operation of the divide-by-N circuit 14, each D Flip Flop 120$_G$ generates a bit of the RANDOM signal. In this embodiment, the divide-by-N circuit 14 divides the loop clock signal FPLL by 2560, generating the feedback delay clock signal, FBCLKD. The feedback delay clock signal, FBCLKD, is delayed by the period of the division of the loop clock signal, FPLL/T, in reference to the feedback clock signal, FBCLK. Therefore, in this embodiment N is 2560. In other embodiments, the N value changes by adding or subtracting D Flip Flops 120$_G$ or the divide-by-N circuit 14 is removed.

Although the present invention has been described with reference to a specific embodiment, further modifications and improvements will occur to those skilled in the art. In other embodiments, portions of the phase locked loop 10 may be performed by a software model program. Software programs perform the functions of the phase detector 11, digital loop filter 12, digital controlled oscillator 13, and divide-by-N circuit 14. Therefore, the phase locked loop exists in a software program and is utilized and revised by program code. It is to be understood therefore, that the invention encompasses all such modifications that do not depart from the spirit and scope of the invention as defined in the appended claims.

What is claimed is:

1. A phase locked loop comprising:
   a phase detector receiving a reference clock signal and a feedback delay clock signal, the phase detector generating a first control signal responsive to a phase relationship between the reference clock signal and the feedback delay clock signal;
   a digital loop filter receiving the first control signal, the digital loop filter generating a second signal representative of a history of the first control signal, wherein the second signal is digital, wherein the digital loop filter further comprises a signal modulator that reduces oscillator quantization error in a phase region; and
   a digital controlled oscillator receiving the second signal, the digital controlled oscillator generating a clock signal characterized by a frequency, the frequency responsive to the second signal.

2. A phase locked loop comprising:
   a phase detector receiving a reference clock signal and a feedback delay clock signal, the phase detector generating a first control signal responsive to a phase relationship between the reference clock signal and the feedback delay clock signal;
   a digital loop filter receiving the first control signal, the digital loop filter generating a second signal representative of a history of the first control signal, wherein the second signal is digital, wherein the digital loop filter further comprises a signal modulator, and wherein the signal modulator transmits the second signal at a higher data rate than receiving the first control signal at an input data rate; and
   a digital controlled oscillator receiving the second signal, the digital controlled oscillator generating a clock signal characterized by a frequency, the frequency responsive to the second signal.

3. A phase locked loop comprising:
   a phase detector receiving a reference clock signal and a feedback delay clock signal, the phase detector generating a first control signal responsive to a phase relationship between the reference clock signal and the feedback delay clock signal;
   a digital loop filter receiving the first control signal, the digital loop filter generating a second signal representative of a history of the first control signal, wherein the second signal is digital; and
   a digital controlled oscillator receiving the second signal, the digital controlled oscillator generating a clock signal characterized by a frequency, the frequency responsive to the second signal, the digital controlled oscillator further comprising:
    a plurality of delay elements where each one of the plurality of delay elements delays a signal one of either a first or second amount;
    a switching circuit selecting one of either a first or a second amount of each of the plurality of delay elements.

4. A method of phase aligning a reference clock signal and a feedback delay clock signal comprising the steps of:
    receiving a reference clock signal and a feedback delay clock signal:
    generating a phase correction signal;
    processing digitally the phase correction signal; and
    generating the feedback delay clock signal by a processed phase correction signal, wherein generating the feedback delay clock signal further comprises:
    controlling a selection of one of at least two circuit paths each comprising a different delay with a modulated signal and the phase correction signal.

5. A method of phase aligning a reference clock signal and a feedback delay clock signal comprising the steps of:
    receiving a reference clock signal and a feedback delay clock signal;
    generating a phase correction signal;
    processing digitally the phase correction signal, responsive to a first signal and a second modulating signal, wherein:
        the first signal (PIC) comprises a specified number (N) of serially ordered bits numbered in a range from one (1) for a most significant bit to a specified number (N) for a least significant bit;
        the second modulating signal (RANDOM) comprises the specified number (N) of serially ordered bits numbered in a range from one (1) for the least significant bit to the specified number (N) for the most significant bit,
    said step of processing comprising the steps of:
        (A) specifying a selected bit index (I) as an integer in the range of one (1) through the specified number (N);
        (B) testing whether a selected bit in PFC identified by the selected bit index (I) is asserted;
        (C) testing whether a selected bit in RANDOM identified by the selected bit index (I) is asserted;
        (D) testing both whether the selected bit in PFC tested in step (B) is asserted and whether the selected bit in RANDOM tested in step (C) is asserted;
        (E) if the selected bit in PFC is asserted in step (B) and the selected bit in RANDOM is asserted in step (C), then testing whether any lower order bits in RANDOM than the selected bit in RANDOM are asserted,
        (F) if any lower order bits in RANDOM than bit B(i) are not asserted in step (E), then asserting an output signal;
        (G) repeating steps (B) through (E) for a loop specifying a different selected bit index (I) until the range of one (1) through the specified number (N) have been selected; and
        (H) negating the output signal if not asserted at least once in the loop in step (F); and
    generating the feedback delay clock signal by a processed phase correction signal.

6. The method in claim 5 wherein an integrated circuit performs the step of processing.

\* \* \* \* \*